United States Patent [19]

Wheatley, Jr.

[11] 3,936,731

[45] Feb. 3, 1976

[54] AMPLIFIER WITH FAST RECOVERY AFTER INPUT SIGNAL OVERSWING

[75] Inventor: Carl Franklin Wheatley, Jr., Somerset, N.J.

[73] Assignee: RCA Corporation, New York, N.Y.

[22] Filed: Nov. 14, 1974

[21] Appl. No.: 523,742

[52] U.S. Cl. ................... 330/17; 330/20; 330/30 R; 330/30 D
[51] Int. Cl.² .......................................... H03F 3/68
[58] Field of Search ............. 307/300; 330/20, 30 R, 330/30 D, 17

[56] References Cited
UNITED STATES PATENTS

| | | | |
|---|---|---|---|
| 3,560,866 | 2/1971 | Haines ......................... | 330/30 D X |
| 3,571,621 | 3/1971 | Hart et al ....................... | 307/313 X |

OTHER PUBLICATIONS
"A Wideband Multiplier for Systems Design," Electronic Engineering, June 1972, pp. 18, 19. 50.

*Primary Examiner*—James B. Mullins
*Attorney, Agent, or Firm*—H. Christoffersen; S. Cohen; A. L. Limberg

[57] ABSTRACT

In a direct-coupled cascade of first and second amplifier stages respectively including first and second complementary-conductivity transistors, the collector electrode of the first transistor being connected to the base electrode of the second transistor, there is a delay in recovery of response to input signal after a sustained input signal overswing condition. This delay is obviated by direct coupling an auxiliary amplifier stage having a gain of relatively low amplitude and opposite sense as compared to the first amplifier stage, in parallel with the first amplifier stage. The auxiliary amplifier prevents the discharge of capacitances in the second amplifier stage when the conduction of the first transistor is cut off. Then, upon the resumption of conduction of the first transistor, no time is needed for re-charging the capacitances before the second transistor can be drawn back into conduction.

23 Claims, 13 Drawing Figures

AMPLIFIER WITH FAST RECOVERY AFTER INPUT SIGNAL OVERSWING

The present invention relates to electric signal amplifiers including circuitry for improving the speed of recovery to normal amplification after input signal overswing.

When a common-emitter transistor input amplifier stage using a PNP (or an NPN) transistor is followed in direct coupled cascade by a common-emitter transistor output amplifier stage using a complementary-conductivity NPN (or PNP) transistor, a problem may arise with respect to recovery from input signals which swing to a potential level more than sufficient to cut off conduction of the input stage transistor. During the time the input stage transistor is non-conductive, the capacitances associated with the output stage transistor lose their charge. When the overswing of input signal is finished and the input stage transistor is biased once again into conduction, it takes a brief time for its collector current to re-charge the capacitances of the output amplifier stage before its transistor can respond to resume its conduction. This effect, the delay in response of the output amplifier stage transistor, is undesirable in most high-frequency amplifier applications.

A similar type of problem occurs in a direct-coupled cascade of the type described in the previous paragraph but wherein the input amplifier stage transistor is connected in a common-base rather than common-emitter configuration.

An amplifier embodying the present invention includes a pair of parallelled input transistor amplifier stages, with gains of opposite sense, the first of which gains is larger than the second, so the output signal of the first input amplifier stage is partially counteracted by the output signal of the second. The combined output signals of these parallelled input amplifier stages are applied to the input circuit of an output amplifier stage. Input signal overswings tend to cut-off the first input amplifier and output amplifier stages simultaneously, during which time the second input amplifier stage continues to supply current to keep the capacitances of the input circuit of the output amplifier stage charged. Therefore, no time is required to re-establish conduction of the output amplifier stage when the overswing condition passes.

In the drawing, wherein corresponding elements in different figures are correspondingly numbered:

each of FIGS. 3 and 9–13 is a partially schematic block diagram of a different amplifier embodying the present invention; and each of FIGS. 4–8 is a schematic diagram of a prior art balanced to single-ended signal converter suitable for inclusion in the differential amplifiers shown in any one of FIGS. 3 and 9–13.

Figure 1:
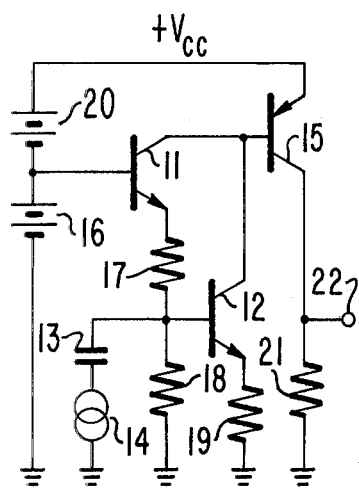
FIG. 1 is a schematic diagram of a circuit configuration in which the present invention may be embodied in either of two ways.

In FIG. 1, NPN transistors 11 and 12 are connected in common-base and common-emitter amplifier configurations, respectively, insofar as input signal supplied to each of them via coupling capacitor 13 from source 14 is concerned. The collector electrodes of transistors 11 and 12 are direct coupled in common to the base electrode of a PNP transistor 15 connected in a common-emitter amplifier configuration.

Potential supply 16 applies forward bias to the base-emitter junction of transistor 11 by direct connection and to the base-emitter junction of transistor 12 by means of the emitter follower action of transistor 11 and the potential division action of resistors 17 and 18. The combined resistance of resistors 17 and 18 in the emitter circuit of transistor 11 provides current feedback to stabilize its quiescent collector current, and a resistor 19 in the emitter circuit of transistor 12 provides current feedback to stabilize its quiescent collector current. The combined collector currents of transistors 11 and 12 supply the base current of transistor 15. The emitter electrode of transistor 15 has the combined potentials of supplies 16 and 20, $+V_{CC}$ applied to it. The potential at the collectors of transistors 11 and 12 is equal to $+V_{CC}$ minus the offset potential across the emitter-base junction of transistor 15. Transistor 15 is shown with a resistive collector load 21 across which an output signal is to be developed responsive to the input signal from source 14 and made available at output terminal 22.

The quiescent collector current of transistor 15 may be stabilized in a number of known ways, none of which is shown since this is immaterial to the present invention. For example, a diode or diode-connected transistor may be connected between the base and emitter electrodes of transistor 15. Or direct coupled feedback may be employed from a tap point on the resistor 21 to the base electrode of transistor 15 or to the emitter electrode of transistor 12.

The gain of the common-base amplifier with transistor 11 is related to the gain of the common-emitter amplifier with transistor 12 in the same ratio as the conductance of resistor 17 to the conductance of resistor 19—that is, the same ratio as the resistance of resistor 19 to the resistance of resistor 17. The resistance of one of the resistors 17 and 19 is made several times larger than that of the other.

In the case where the resistance of resistor 17 is low compared to that of resistor 19, the common-base amplifier transistor 11 has higher gain than the common-emitter amplifier transistor 12 and during normal input signal conditions, its non-inverting amplifier action predominates over the inerting amplifier action of transistor 12. When the input signal swings sufficiently positive—that is, to within a $V_{BE}$ of the potential at the positive terminal of supply 16—an overswing condition exists wherein transistor 11 is rendered non-conductive. ($V_{BE}$ is the offset potential across the base-emitter junction of a transistor—that is, about 0.6 volts for 1-0-0 silicon transistor.) Without transistor 12, this would result in no current being withdrawn from the base electrode of transistor 15. In such instance, the capacitance at the base electrode of transistor 15 would no longer be supplied a charging current and the leakage resistance of the base-emitter junction of that transistor could discharge this capacitance. When conduction of transistor 11 was restored, the stray capacitance would have to be re-charged sufficiently to provide a base-emitter potential to transistor 15 sufficiently large to bias it into conduction, and this would introduce a delay into its collector current response when the input signal overswing condition passed.

With the use of common-emitter amplifier transistor 12, however, the operation differs. For when the input signal from source 13 swings sufficiently positive to cut off conduction in common-base amplifier transistor 11, it continues to forward bias the base-emitter junction of transistor 12. The collector current of transistor 12 continues in response to this forward-biasing and maintains the charge upon the capacitance at the base electrode of transistor 15. It is usually desirable to keep the gain of the common-emitter amplifier including transistor 12, as small as possible to accomplish this purpose in this first alternative construction of the FIG. 1 circuit. This is done to minimize the fold-over of output signal caused by the continuing amplification of common-emitter transistor 12 when common-base transistor 11 is non-conductive.

In the case where the resistance of resistor 19 is low compared to that of resistor 17, the common-emitter amplifier transistor 12 has higher gain that the common-base amplifier transistor 11. So, during normal input signal condition, the inverting amplifier action of transistor 12 predominates over the non-inverting amplifier action of transistor 11. When the input signal swings sufficiently negative—that is, to within a $V_{BE}$ of the potential at the ground reference potential—an overswing condition exists wherein transistor 12 is rendered non-conductive. Without transistor 11, this would result in no current being withdrawn from the base electrode of transistor 15. In such instance, the capacitance at the base electrode of transistor 15 would no longer be supplied a charging current and the leakage resistance of the base-emitter junction of that transistor could discharge this capacitance. When conduction of transistor 12 was restored, the stray capacitance would have to be recharged sufficiently to produce a potential large enough to overcome the base-emitter offset potential of transistor 15 before it could be biased into conduction, and this would introduce a delay into its response when the input signal overswing condition passed.

With the use of common-base amplifier transistor 11, however, the operation differs. For when the input signal from source 14 swings sufficiently negative to cut off conduction in common-emitter amplifier transistor 12, it continues to forward bias the base-emitter junction of transistor 11. The collector current of transistor 11 continues in response to this forward biasing and maintains the charge upon the capacitance at the base electrode of transistor 15. It is usually desirable to keep the gain of the common-base amplifier 11 as small as possible to accomplish this purpose in this second alternative construction of the FIG. 1 circuit. This is to minimize the fold-over of output signal caused by the continuing amplification of common base transistor 11 when common-emitter transistor 12 is non-conductive.

Figure 2:
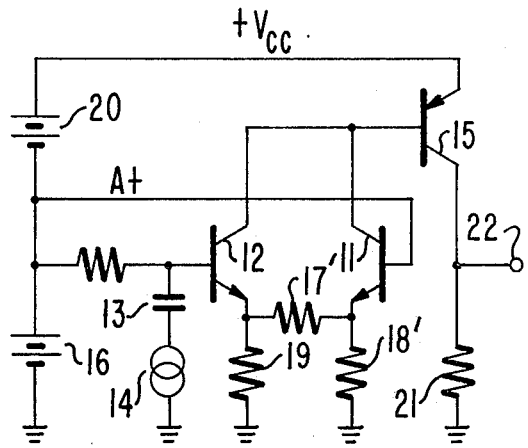
FIG. 2 is a schematic diagram of a variant of one of the embodiments exemplified by FIG. 1.

FIG. 2 is a variant of the second alternative construction of FIG. 1 wherein the emitter of the common-base amplifier transistor 11 has input signal coupled to it from source 14 by means including the emitter follower action of common-emitter amplifier transistor 12. This variant provides the foundation for construction of differential amplifiers embodying the present invention.

Figure 3:
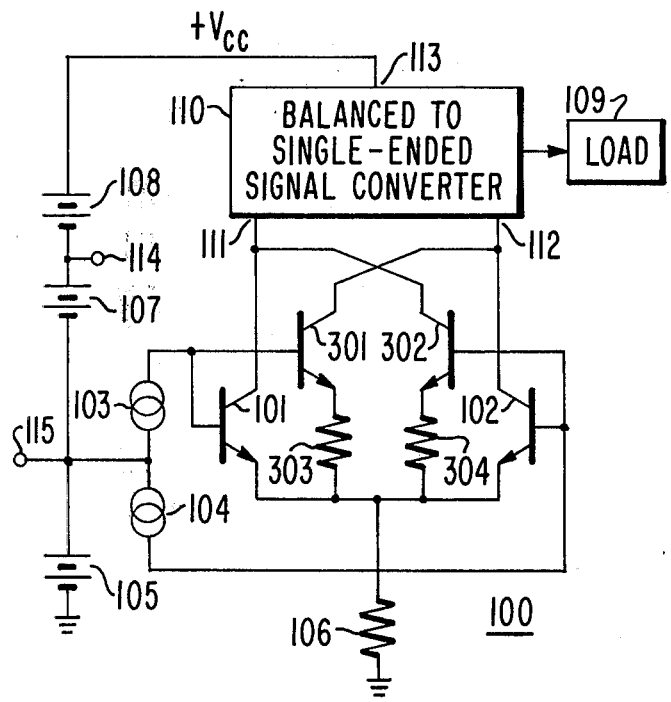

FIG. 3 shows a differential amplifier 100, which includes a pair of emitter-coupled transistors 101 and 102 accepting input signals from signal sources 103 and 104 at their respective base electrodes. Direct potential supply 105 supplies quiescent bias potential $V_{115}$ to the base electrodes of transistors 101 and 102 to forward bias their respective base-emitter junctions, the joined emitter electrodes of transistors 101 and 102 being returned to ground reference potential through a resistor 106. The quiescent potential across resistor 106 is $V_{115}$ minus the quiescent base-emitter offset potential $V_{BE101-102}$ characteristic of transistors 101 and 102. $V_{BE101-102}$ is substantially constant over a wide range of currents (at a value of about 550 to 650 millivolts for 1-0-0 silicon transistors). The combined quiescent emitter currents of transistors 101 and 102 are determined in accordance with Ohm's Law by dividing $V_{115} - V_{BE101-102}$ by $R_{106}$, the resistance of resistor 106.

Transistors 101 and 102 respond to the difference between the input signals applied between their base electrodes with push-pull or balanced variations in their respective collector currents. The collector electrodes of transistors 101 and 102 are direct current conductively coupled to a positive operating potential, $+V_{CC}$, shown as being supplied by the serially connected direct potential supplies 105, 107 and 108. This direct current conductive coupling is via a balanced to single-ended signal converter 110, which responds to the collector current variations of transistors 101 and 102 so as to constructively combine them to provide a single-ended output signal for application to a load 109. FIGS. 4–8 illustrative various known configurations which represent suitable forms for the balanced to single-ended signal converter. Terminals 111, 112 and 113 are the terminals connecting the balanced to single-ended signal converter to the collector electrode of transistor 101, to the collector electrode of transistor 102 and to $+V_{CC}$, respectively.

Figure 4:
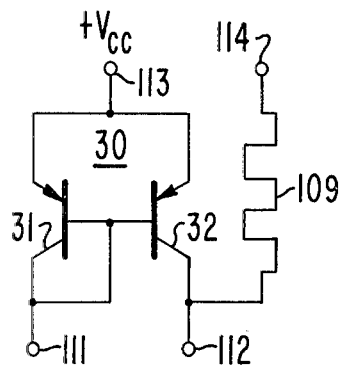

In FIG. 4, the balanced to single-ended signal converter comprises transistors 31 and 32 connected as a current mirror amplifier 30. Current mirror amplifier action is as follows. The direct-coupled collector-to-base feedback of transistor 31 regulates its base-emitter potential to a value such that its collector current suffices to supply the collector current demands of transistor 101. This base-emitter potential of transistor 31 is also the base-emitter potential of transistor 32. Transistor 32 has transconductance characteristics matching those of transistor 31, so its collector current responsive to the base-emitter potential is the same as that of transistor 31. The collector current of transistor 32 therefore varies in amplitude as does the collector current of transistor 101, but in the opposite sense of swing, so that its variations due to differential mode components of the input signal may be constructively combined—that is, added—to the variations in the collector current of transistor 102 due to differential components of the input signals. At the same time, variations in the collector currents of transistors 32 and 102 due to common-mode components of the input signals are destructively combined—that is, cancelled out by each other insofar as flowing to the load 109.

Figure 5:
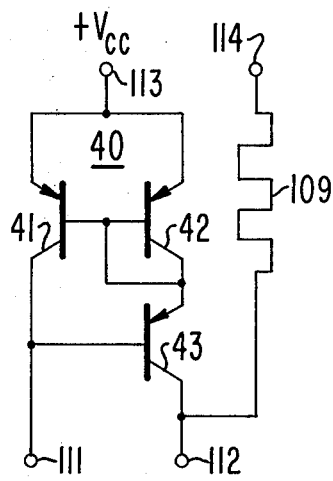

FIG. 5 shows another well-known current mirror amplifier 40 connected as a balanced to single-ended signal converter. Transistors 41 has its base-emitter potential adjusted by direct-coupled collector-to-base feedback applied by the emitter-follower action of transistor 43, this adjustment of its base-emitter potential being to a level such that the collector current supplied by transistor 41 meets the collector current demand of transistor 101. The base-emitter potential of transistor 41 is also supplied to transistor 42, the transconductance characteristic of which is the same as that of transistor 41. Accordingly, the collector current of transistor 42 is like that of transistor 41. The collector current of transistor 42 is coupled without substantial attenuation to terminal 112 by the common-base amplifier action of transistor 43. So, transistor 43 supplies a collector current of substantially the same amplitude as demanded by transistor 101.

Figure 6:
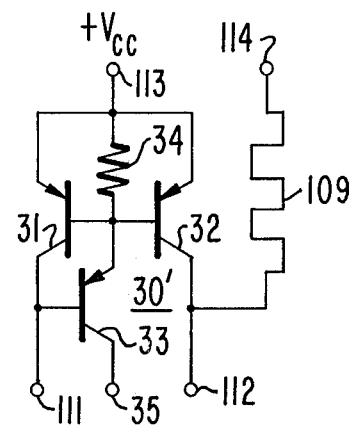

FIG. 6 shows yet a third well-known current mirror amplifier 30' connected as a balanced to single-ended signal converter. This current mirror amplifier 30' has transistor 31 provided direct-coupled collector-to-base degenerative feedback by means of an emitter-follower transistor 33 rather than by direct connection. The collector electrode of transistor 33 is connected via terminal 35 to a potential at least 1 volt less positive than that at terminal 113—conventionally, this is ground potential. Resistor 34 is a "pull-up" resistor to speed the cutting off of the conduction of transistors 31 and 32 when no current is demanded from terminal 111.

Equal value emitter degeneration resistors may be used with transistors 31 and 32 in the FIG. 4 and FIG. 6 configurations or with transistors 41 and 42 in the FIG. 5 configuration.

Figure 7:
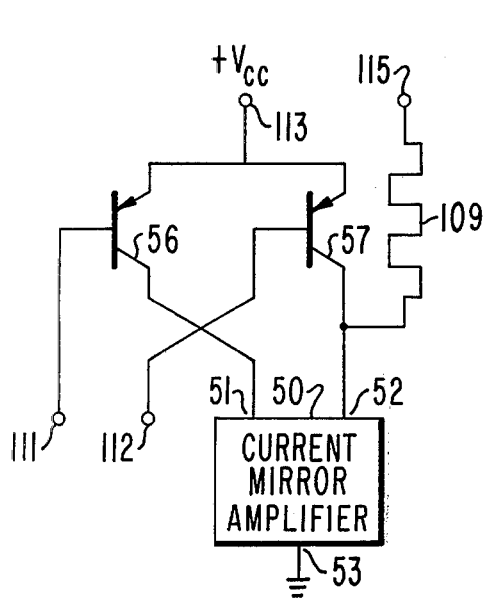

FIG. 7 shows a balanced to single-ended signal converter using a current mirror amplifier 50 having input, output and common terminals at 51, 52 and 53, respectively. This current mirror amplifier can be similar to any one of those shown in FIGS. 4, 5 or 6, for example, except for being constructed with NPN rather than PNP transistors. Transistors 56 and 57 have equal common-emitter forward current gains. Transistors 56 is connected as a common-emitter amplifier linking terminal 111 to input terminal 51 of the current mirror amplifier 50, and transistor 57 is connected as a common-emitter amplifier linking terminal 112 to the output terminal 52 of the current mirror amplifier 50. This arrangement permits the load 109 to be biased at $V_{115}$ to which the input signal sources 103 and 104 are also biased, so voltage gain or transconductance can be obtained from differential amplifier 100 without attendant potential translation.

Figure 8:
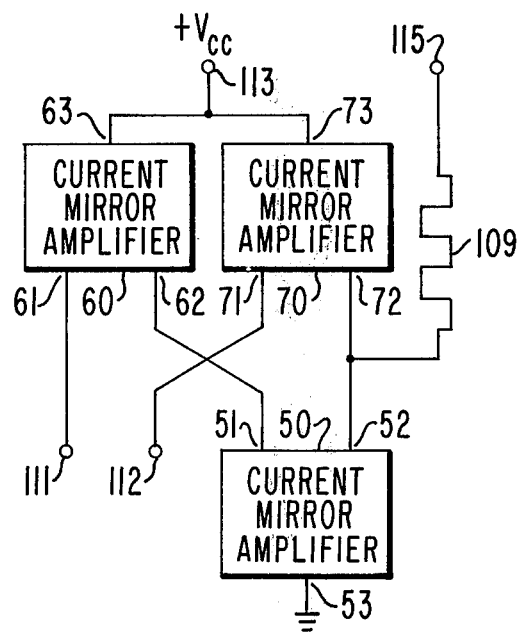

FIG. 8 shows a balanced to single-ended converter similar to that shown in FIG. 7, but in which the common-emitter amplifier transistors 56 and 57 are replaced by current mirror amplifiers 60 and 70, respectively. The input, output and common terminals of current mirror amplifier 60 are at 61, 62 and 63, respectively; those of current mirror amplifier 70, at 71, 72 and 73, respectively. Current mirror amplifiers 60 and 70 may be of the same type as any of those shown in FIGS. 4, 5 and 6, for example.

The FIG. 3 configuration as thus far described using a balanced to a single-ended signal converter of the type shown in any of FIGS. 4-8 is known to the prior art and will exhibit the problem of delay distortion when an input signal overswing removes transistor 101 from conduction. Capacitance associated with the input circuitry of any of the current mirror amplifiers used as a balanced to single-ended signal converter must not be permitted to discharge fully during input signal overswing conditions.

Delay distortion caused by input signal overswing is forestalled in the FIG. 3 circuit by elements 301-304 connected as shown. One way to view the operation of these elements is that elements 103, 101, 102, 304 and 302 respectively correspond quite closely in operation to elements 14, 12, 19, 17' and 11 of FIG. 2 insofar as input signal from source 103 alone is concerned. Elements 104, 102, 101, 303 and 301 respectively correspond quite closely in operation to elements 14, 12, 19, 17' and 11 of FIG. 2 insofar as source 104 alone is concerned in this view.

Another view is to regard transistors 101 and 102 as transistors having their respective input circuits parallelly connected with the input circuits of transistors 301 and 302, respectively. Each pair of transistors—101 and 102, 301 and 302—responds to the difference between input signals from sources 103 and 104 to provide push-pull collector currents from respective ones of its transistors. Because of their respective emitter degeneration resistors 303 and 304, transistors 301 and 302 have lower gains than transistors 101 and 102. So, transistor 302 contributes smaller and out-of-phase collector current variations to be admixed with the larger collector current variations of transistor 101. This continuously maintains at least a minimum current flow to terminal 111 of the balanced to single-ended signal converter 110, keeping the capacitance associated with circuitry of a current mirror amplifier therewithin—such 30, 40, 30', 50, 60 or 70—at least partially charged at all times. This eliminates delay distortion caused by input signal overswing removing transistor 101 from conduction.

Also, transistor 301 contributes smaller and out-of-phase collector current variations to be admixed with the larger collector current variations of transistor 102. This continuously maintains at least a minimum current flow to terminal 112 of the balanced to single-ended signal converter 110. When the balanced to single-ended converter is of the type as shown in FIG. 7, this minimum current flow maintains the capacitances associated with the input circuitry of common-emitter amplifier transistor 57 partially charged at all times, eliminating delay distortion caused by input signal overswing removing transistor 102 from conduction. Similarly, when the FIG. 8 circuit is used as the balanced to single-ended signal converter, the capacitance associated with the input circuitry of current mirror amplifier 70 is prevented from discharging during input signal overswings cutting off conduction in transistor 102, thus avoiding delay distortion.

When transistors 101 and 301 are cut off from conduction, the mirrored collector current of transistor 302 is insufficiently large compared to the collector current of transistor 102 to have substantial effect upon the output signal supplied to load 109. And when transistors 102 and 302 are cut off from conduction, the collector current of transistor 301 is insufficiently large compared to the mirrored collector current of transistor 101 to have substantial effect upon the output signal supplied to load 109. Only a slight flattening of output signal occurs for the input signal overswing condition, and there is no "fold-over" of output signal as is characteristic of the FIG. 1 and FIG. 2 embodiments of the invention. The embodiments of the present invention shown in FIGS. 9-13 are free from "fold-over" of output signal also, for similar reasons. This freedom is very important when an overall feedback loop connection coupling the output signal of the balanced to single-ended signal converter 110 to the base electrode of transistor 101 or 102 is made, since it substantially reduces the problem that the nature of the feedback loop may change from degenerative to regenerative (or vice-versa). Such change would make it virtually impossible to design a well-behaved feedback system.

The lower transconductances of transistors 301 and 302 as compared to transistors 101 and 102 has been attributed to the presence of the emitter degeneration resistances 303 and 304 providing current feedback for signal, which loosens the emitter-coupling of transistors 301 and 302 to each other and, more importantly, to transistors 101 and 102 as compared to the emitter-coupling of transistors 101 and 102. There is additionally another mechanism concurrently at work to reduce the transconductances of transistors 301 and 302 relative to those of transistors 101 and 102. This is the current feedback of common-mode signal incurred across resistors 303 and 304 working to apply "reverse gain control" potential to the emitter electrodes of transistors 301 and 302. That is, direct current—or other common-mode current—flowing through resistors 303 and 304 develops potentials across them which reduces the base-emitter potentials of transistors 301 and 302 relative to the base-emitter potentials of transistors 101 and 102. Each 18 millivolts of potential drop across each of resistors 303 and 304 reduces the emitter currents of transistors 301 and 302 by two times relative to the emitter currents of transistors 101 and 102. Since, as is well known, the transconductance of a transistor is proportional to its emitter current, each 18 millivolts of potential drop across each of resistors 303 and 304, caused by common-mode current flow will reduce the transconductances of transistors 301 and 302 by 6$d$B relative to the transconductances of transistors 101 and 102.

The modulation of the transconductances of transistors 301 and 302 in response to changing common-mode components of the input signals from sources 103 and 104 generally presents no serious problem. This is because the collector current variations of transistors 301 and 302 are typically only 1 or 2 percent as large as those of transistors 101 and 102, and slight variation in this small fraction has little effect on the amplitude of the output signal to the load 109. The magnitude of the problem can be reduced further by replacing resistor 106 with means providing a constant current sink.

Figure 9:
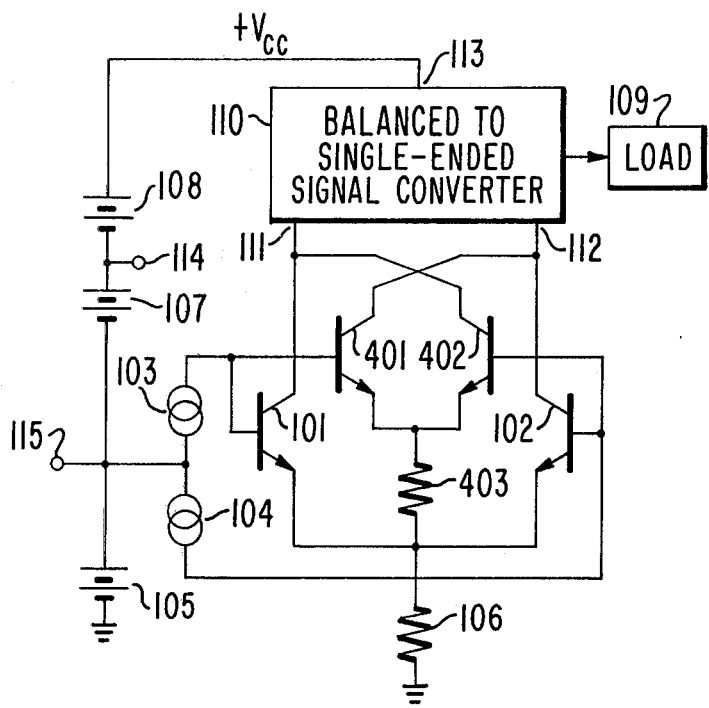

In FIG. 9, the sole mechanism for reducing the transconductance of transistors 401 and 402 respective to those of transistors 101 and 102 is the "reverse gain control" afforded by the potential drop across resistor 403 responsive to common-mode current flow. In this configuration also, the resistor 106 may be replaced by means providing a constant current sink to avoid modulation of the transconductances of transistors 401 and 402 by common-mode input signal variations from sources 103 and 104.

Figure 10:
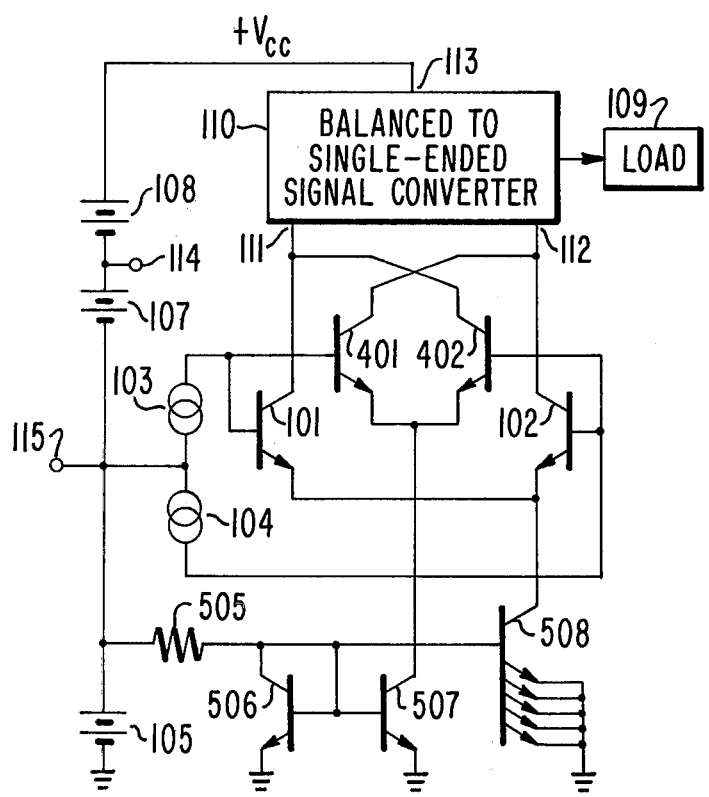

FIG. 10 shows circuitry in which a constant current is withdrawn from the joined emitter electrodes of transistors 401 and 402 which is smaller than a constant current withdrawn from the joined emitter electrodes of transistors 101 and 102. This causes the transconductances of transistors 401 and 402 to be smaller than the transconductances of transistors 101 and 102, as desired. More particularly, the potential from supply 105 is applied to the series connection of resistor 505 and diode-connected transistor 506 to develop a temperature-compensated base-emitter potential for transistors 507 and 508. Transistor 508 has a total effective base-emitter junction area several times larger than that of transistor 507, so its transconductance is larger than that of transistor 507. Therefore, transistor 508 demands a larger current from the joined emitter electrodes of transistors 101 and 102, than transistor 507 does from the joined emitter electrodes of transistors 401 and 402.

The larger effective base-emitter junction area of transistor 508 may be obtained either by parallelling several base-emitter junctions of the size used in transistor 507, or simply by making the base-emitter junction area of transistor 508 larger within a single periphery than that of transistor 507; the drawing convention showing multiple emitters for transistor 508, but only a single-emitter for transistor 507, is to be construed as indicating either possibility.

Figure 11:
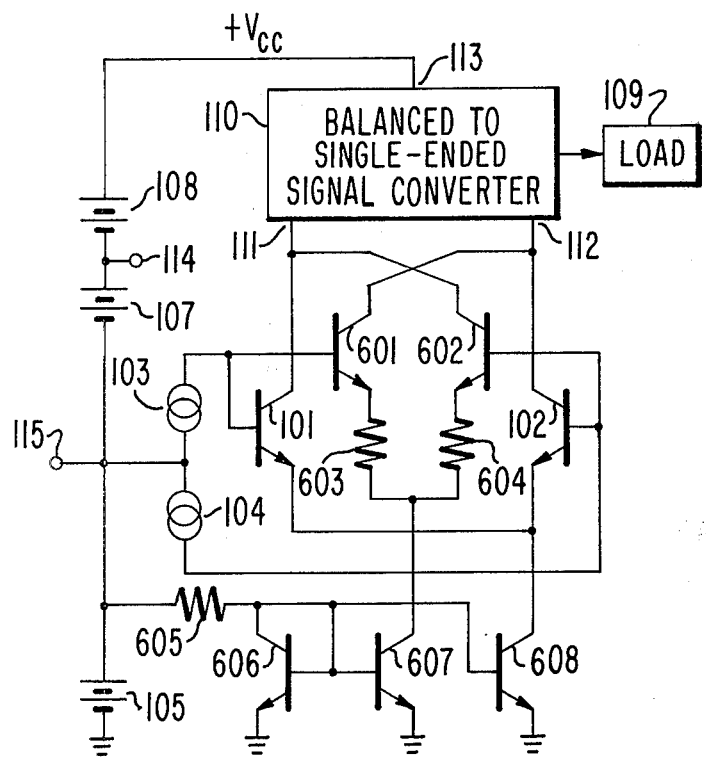

FIG. 11 shows circuitry in which a constant current is withdrawn from the joined emitter electrodes of transistors 601 and 602 which is equal to the constant current withdrawn from the joined emitter electrodes of transistors 101 and 102. The emitter degeneration resistors 603 and 604 are the only important mechanism for reducing the gains of transistors 601 and 602 relative to those of transistors 101 and 102. Elements 605, 606, 607 and 608 operate substantially like elements 505, 506, 507 and 508, respectively, of FIG. 10 except transistors 607 and 608 have substantially similar effective base-emitter junction areas to each other and therefore substantially similar transconductances to each other. A variation of the FIG. 11 circuit in which transistors 101 and 102 are each provided emitter degeneration resistors of lower resistance than the resistance of emitter degeneration resistors 603 and 604 is useful. The relative gains of the transistors are then substantially in inverse proportion to the respective resistances of the respective emitter degeneration resistors. The FIG. 3 circuit may also be similarly varied.

Figure 12:
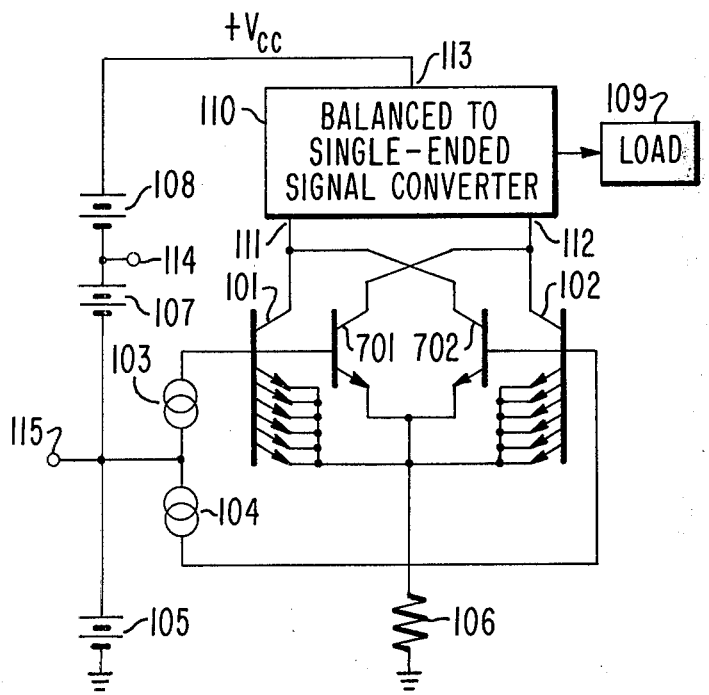

FIG. 12 shows circuitry in which the transconductances of transistors 701 and 702 are made small compared to the transconductances of transistors 101 and 102. This is done by making the effective areas of the base-emitter junctions of transistors 701 and 702 smaller than the effective areas of the base-emitter junctions of transistors 102 and 101, respectively. This method of scaling current gains results in the same proportions between transconductances over wide ranges of current. Therefore, this scaling method is favored when a resistor 106 is used to set quiescent current levels of the differential amplifier transistors 101, 102, 701 and 702.

The circuits of FIGS. 10 and 12 enjoy the following advantage with respect to the circuits of FIGS. 3, 9 and 11. The relative gains of the emitter-coupled differential amplifiers with cross-connected outputs to the balanced to single-ended signal converter 110 are proportioned by scaling of transistor transconductances in the configurations of FIGS. 10 and 12. No matching of the conductances of resistors to be transconductances of transistors therefore need be made.

Figure 13:
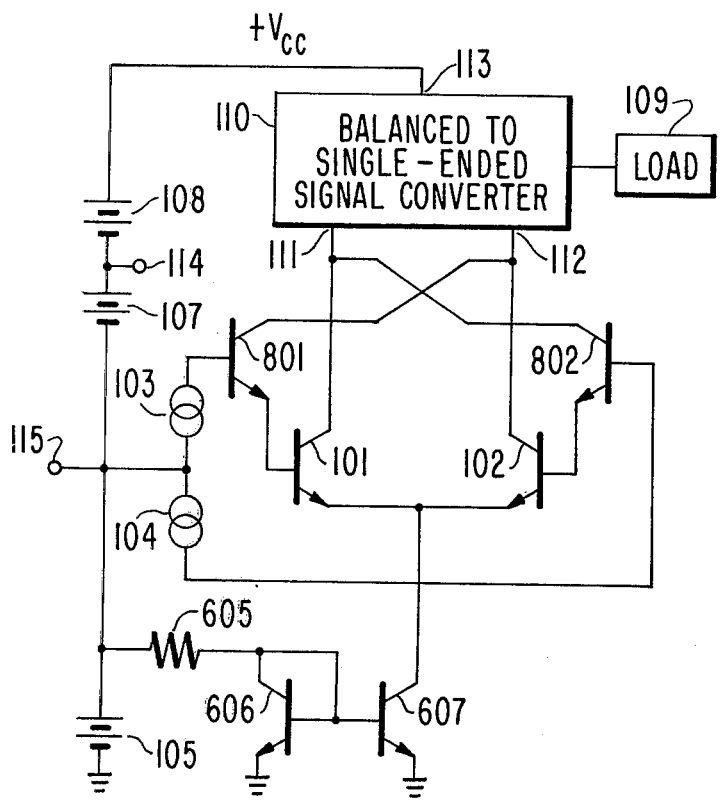

FIG. 13 shows circuitry in which the relative transconductances of the differential amplifier comprising transistors 101 and 102 and of the differential amplifier comprising transistors 801 and 802 is scaled according to the common-emitter forward current gains or $h_{fe}$'s of transistors 101 and 102. Since transistors 101 and 802 have interconnected collectors, they can share the same isolation region in a monolithic integrated circuit, their resultant proximity facilitates very close tracking of their temperatures. So too for transistors 102 and 801. This results in the combined base-emitter offset potentials of transistors 801 and 101 tracking the combined base-emitter offset potentials of transistors 802 and 102. This is so despite the fact that transistors 101 and 102 cannot share the same isolation region and so must have slightly different temperatures. Also, this is so despite the fact that transistors 801 and 802 cannot share the same isolation region and so must have slightly different temperatures.

Certain common features of the circuits of FIGS. 3, 9, 10, 11, 12 and 13 should be apparent. Each has a first differential amplifier (shown as an emitter-coupled transistor differential amplifier comprising transistors 101 and 102) which has a transconductance higher than that of a second differential amplifier (shown as an emitter-coupled transistor differential amplifier variously comprising transistors 301 and 302, or 401 and 402, or 601 and 602, or 701 and 702, or 801 and 802), having its input circuit parallelled with that of the first differential amplifier. This combination has a transconductance equal to the difference of the transconductances of the individual differential amplifiers for the normal range of signals. Further, this combination, when direct coupled to the input circuit of a succeeding amplifier stage, which input circuit exhibits associated capacitance, will avoid the undesirable production of delay distortion arising for the reasons discussed above.

While the invention has been described with particular reference to bipolar transistors, it should be recognized that the invention is applicable to other analogous amplifier devices—e.g., field-effect transistors—analogously connected. The invention is also applicable when using vacuum tubes as one conductivity type device and PNP transistors as the other conductivity type device. The invention may also be embodied in circuits combining the use of bipolar and field-effect transistors. The term "transistor" and related terminology in the claims should be so construed as to include these alternatives within the scope of these claims. For example, the terms "base", "emitter" and "collector" are to include within their scope the terms "gate", "source", and "drain", respectively, with reference to field-effect transistors.

What is claimed is:

1. An amplifier comprising:
   first and second terminals for receiving an operating potential therebetween;
   third and fourth terminals for input and output signals, respectively;
   a first transistor of a first conductivity type having an emitter electrode connected to said first terminal, having a base electrode, and having a collector electrode coupled to said fourth terminal;
   direct current conductive impedance means connecting said first transistor collector electrode to said second terminal;
   second and third transistors of a second conductivity type, each having a collector electrode coupled to said first transistor base electrode, each having an emitter and a base electrode; said first and said second conductivity types being complementary to each other;
   first and second conductive means, one having higher impedance for signal than the other, said first conductive means connecting said third terminal to said second transistor emitter electrode, second conductive means connecting said third transistor emitter electrode to said second terminal;
   further means connecting said second transistor in common-base amplifier configuration; and
   further means connecting said third transistor in common-emitter amplifier configuration including a connection of said third terminal to said third transistor base electrode.

2. An amplifier comprising:
   first and second terminals for receiving an operating potential therebetween;
   third and fourth terminals for input and output signals, respectively;
   a first transistor of a first conductivity type having an emitter electrode connected to said first terminal, having a base electrode, and having a collector electrode coupled to said fourth terminal;
   direct current conductive impedance means connecting said first transistor collector electrode to said second terminal;
   second and third transistors of a second conductivity type, each having a collector electrode coupled to said first transistor base electrode, each having an emitter and a base electrode, said first and said second conductivity types being complementary to each other;
   first and second conductive means, one having higher impedance for signal than the other, said first conductive means connecting said third transistor emitter electrode to said second transistor emitter electrode, said second conductive means connecting said third transistor emitter electrode to said second terminal;
   further means connecting said second transistor in common-base amplifier configuration; and
   further means connecting said third transistor in common-emitter amplifier configuration including a connection of said third terminal to said third transistor base electrode.

3. In combination:
   a first differential amplifier, having an input circuit and an output circuit, and exhibiting a transconductance $g_m$ between its input and output circuits;
   a second differential amplifier, having an input circuit and an output circuit, and exhibiting a transconductance $g_m'$ between its input and output circuits;
   means for coupling the input circuits of said first and said second differential amplifiers in parallel to receive an input signal potential; and
   a balanced to single-ended signal converter comprising a current mirror amplifier with a common terminal connected to a point of fixed potential, an input terminal and an output terminal between which the output circuits of said first and said second circuits are cross-coupled so that their combined transconductance is substantially $g_m-g_m'$ for the normal range of signals, said cross-coupled connection preventing the discharge of capacitances in the current mirror amplifier during input signal overswings.

4. An amplifier comprising:
   first and second terminals for receiving an operating potential;
   third and fourth terminals for receiving input signals;
   first, second, third, and fourth transistors of similar conductivity type, each having a base and an emitter and a collector electrode, the base electrodes of said first and said third transistors being connected to said third terminal, the base electrodes of said second and said fourth transistors being connected to said fourth terminal;
   first resistive means connecting the emitter electrodes of said first and said third transistors;

second resistive means connecting the emitter electrodes of said second and said fourth transistors;

means for direct current conductively coupling the emitter electrodes of each of said first and said second transistors to said second terminal; and balanced to single-ended signal converter means having a first input terminal to which the collector electrodes of said first and said fourth transistors are connected, having a second input terminal to which the collector electrodes of said second and said third transistors are connected, having a common terminal connected to said first terminal and direct current conductive paths between each of its first and second input terminals and its common terminal, and having an output terminal for connection of a load.

5. An amplifier as set forth in claim 4 wherein said balanced to single-ended signal converter includes:

a fifth and a sixth transistors being of a conductivity type complementary to that of said first through fourth transistors, having respective emitter electrodes each connected to said first terminal, having respective collector electrodes direct current conductively coupled to the first and second input terminals of said balanced to single-ended signal converter, and having respective base electrodes to which said first input terminal is direct coupled, said second input terminal being coupled to said output terminal.

6. An amplifier as set forth in claim 4 wherein said balanced to single-ended signal converter includes:

a fifth and a sixth transistors being of a conductivity type complementary to that of said first through fourth transistors having respective emitter electrodes connected to said first terminal, having respective base electrodes to which the first and second input terminals of said balanced to single-ended signal converter are respectively direct coupled, and having respective collector electrodes, said sixth transistor collector electrode coupled to said output terminal, and a current mirror amplifier having a common terminal connected to said second terminal, having an input terminal to which the collector electrode of said fifth transistor is connected, and having an output terminal connected to the output terminal of said balanced to single-ended signal converter.

7. An amplifier comprising:

first and second terminals for receiving an operating potential;

third and fourth terminals for receiving input signals;

first, second, third and fourth transistors of similar conductivity type, each having a base and an emitter and a collector electrode, the base electrodes of said first and said third transistors being connected to said third terminal, the base electrodes of said second and said fourth transistors being connected to said fourth terminal;

resistive means having a first end to which the emitter electrodes of said first and said second transistors are connected and having a second end to which the emitter electrodes of said third and said fourth transistors are connected;

means for direct current conductively coupling the first end of said resistive means to said second terminal; and balanced to single-ended signal converter means having a first input terminal to which the collector electrodes of said first and said fourth transistors are connected, having a second input terminal to which the collector electrodes of said second and said third transistors are connected, having a common terminal connected to said first terminal and direct current conductive paths between each of its first and second input terminals and its common terminal, and having an output terminal for connection to a load.

8. An amplifier as set forth in claim 7 wherein said balanced to single-ended signal converter includes:

a fifth and a sixth transistors being of a conductivity type complementary to that of said first through fourth transistors, having respective emitter electrodes each connected to said first terminal, having respective collector electrodes direct current conductive coupled to the first and second input terminals of said balanced to single-ended signal converter, and having respective base electrodes to which said first input terminal is direct coupled, said second input terminal being coupled to said output terminal.

9. An amplifier as set forth in claim 7 wherein said balanced to single-ended signal converter includes:

a fifth and a sixth transistors being of a coductivity type complementary to that of said first through fourth transistors having respective emitter electrodes connected to said first terminal, having respective base electrodes to which the first and second input terminals of said balanced to single-ended signal converter are respectively direct coupled, and having respective collector electrodes, said sixth transistor collector electrode coupled to said output terminal; and a current mirror amplifier having a common terminal connected to said second terminal, having an input terminal to which the collector electrode of said fifth transistor is connected, and having an output terminal connected to the output terminal of said balanced to single-ended signal converter.

10. An amplifier comprising:

first and second terminals for receiving an operating potential;

third and fourth terminals for receiving input signals;

first, second, third and fourth transistors of similar conductivity type, each having a base and an emitter and a collector electrode, the base electrodes of said first and said third transistors being connected to said third terminal, the base electrode of said second and said fourth transistors being connected to said fourth terminal;

first and second constant current source means, said first constant current source means connected between said second terminal and the joined emitter electrodes of said first and said second transistors to forward bias them, said second constant current source means connected between said second terminal and the joined emitter electrodes of said third and said fourth transistors to forward bias them, the currents supplied by said first and said second constant current source means being proportioned to condition said first and said second transistors for higher transconductances than said third and said fourth transistors; and balanced to single-ended signal converter means having a first input terminal to which the collector electrodes of said first and said fourth transistors are connected, having a second input terminal to which the collector electrodes of said second and said third transistors are connected, having a common terminal connected to said first terminal and direct current conductive paths between each of its first and second input terminals and to its common terminal, and having an output terminal for connection to a load.

11. An amplifier as set forth in claim 10 wherein said balanced to single-ended signal converter includes:
a fifth and a sixth transistors being of a conductivity type complementary to that of said first through fourth transistors, having respective emitter electrodes each connected to said first terminal, having respective collector electrodes direct current conductively coupled to the first and second input terminals of said balanced to single-ended signal converter, and having respective base electrodes to which said first input terminal is direct coupled, said second input terminal being coupled to said output terminal.

12. An amplifier as set forth in claim 10 wherein said balanced to single-ended signal converter includes:
a fifth and a sixth transistors being of a conductivity type complementary to that of said first through fourth transistors having respective base electrodes to which the first and second input terminals of said balance to single-ended signal converter are respectively direct coupled, and having respective collector electrodes, said sixth transistor collector electrode coupled to said output terminal; and
a current mirror amplifier having a common terminal connected to said second terminal, having an input terminal to which the collector electrode of said fifth transistor is connected, and having an output terminal connected to the output terminal of said balanced to single-ended signal converter.

13. An amplifier comprising:
first and second terminals for receiving an operating potential;
third and fourth terminals for receiving input signals;
first, second, third and fourth transistors of similar conductivity type, each having a base and an emitter and a collector electrode, the base electrodes of said first and said third transistors being connected to said third terminal, the base of electrode of said second and said fourth transistors being connected to said fourth terminal;
first and second similar direct current conductive means having first ends connected to the respective emitter electrodes of said first and said second transistors and having second ends;
third and fourth similar direct current conductive means having first ends connected to the respective emitter electrodes of said third and said fourth transistors, having second ends, and being of higher impedance than said first and said second direct current conductive means;
first constant current source means connected between said second terminal and the second ends of said first and said second direct current conductive means and poled to forward bias the emitter electrodes of said first and said second transistors;
second constant current source means connected between said second terminal and the second ends of said third and said fourth direct current conductive means and poled to forward bias the emitter electrodes of said third and said fourth transistors; and balanced to single-ended signal converter means having a first input terminal to which the collector electrodes of said first and said fourth transistors are connected, having a second input terminal to which the collector electrodes of said second and said third transistors are connected, having a common terminal connected to said first terminal and direct current conductive paths between each of its first and second input terminals and its common terminal and having an output terminal for connection to a load.

14. An amplifier as set forth in claim 13 wherein said balanced to single-ended signal converter includes:
a fifth and a sixth transistors being of a conductivity type complementary to that of said first through fourth transistors, having respective emitter electrodes each connected to said first terminal, having respective collector electrodes direct current conductively coupled to the first and second input terminals of said balanced to single-ended signal converter, and having respective base electrodes to which said first input terminal is direct coupled, said second input terminal being coupled to said output terminal.

15. An amplifier as set forth in claim 13 wherein said balanced to single-ended signal converter includes:
a fifth and a sixth transistors being of a conductivity type complementary to that of said first through fourth transistors having respective emitter electrodes connected to said first terminal, having respective base electrodes to which the first and second input terminals of said balanced to single-ended signal converter are respectively direct coupled, and having respective collector electrodes, said sixth transistor collector electrode coupled to said output terminal, and
a current mirror amplifier having a common terminal connected to said second terminal, and having an input terminal to which the collector electrode of said fifth transistor is connected, and having an output terminal connected to the output terminal of said balanced to single-ended signal converter.

16. An amplifier comprising:
first and second terminals for receiving an operating potential;
third and fourth terminals for receiving input signals;
first, second, third and fourth transistors of similar conductivity type, each having a base and an emitter and a collector electrode, their emitter electrodes being joined at a common interconnection, the base electrodes of said first and said third transistors being connected to said third terminal, the base electrodes of said second and said fourth transistors being connected to said fourth terminal, said first and said second transistors having similar transconductance characteristics, said third and said fourth transistors having similar transconductance characteristics differing from those of said first and said second transistors;
means for direct current conductively coupling said common interconnection to said second terminal; and
balanced to single-ended signal converter means having a first input terminal to which the collector electrodes of said first and said fourth transistors are connected, having a second input terminal to which the collector electrodes of said second and said third transistors are connected, having a common terminal connected to said first terminal and direct current conductive paths between each of its first and second input terminals and its common terminal, and having an output terminal for connecting to a load.

17. An amplifier as set forth in claim 16 wherein said balanced to single-ended signal converter includes:
a fifth and a sixth transistors being of a conductivity type complementary to that of said first through fourth transistors, having respective emitter electrodes each connected to said first terminal, having respective collector electrodes direct current conductively coupled to the first and second input terminals of said balanced to single-ended signal converter, and having respective base electrodes to which said first input terminal is direct coupled, said second input terminal being coupled to said output terminal.

18. An amplifier as set forth in claim 16 wherein said balanced to single-ended signal converter includes:
a fifth and a sixth transistors being of a conductivity type complementary to that of said first through fourth transistors having respective emitter electrodes connected to said first terminal, having respective base emitter electrodes to which the first and second input terminals of said balanced to single-ended signal converter are respectively direct coupled, and having respective collector electrodes, said sixth transistor collector electrode coupled to said output terminal; and
a current mirror amplifier having a common terminal connected to said second terminal, having an input terminal to which the collector electrode of said fifth transistor is connected, and having an output terminal connected to the output terminal of said balanced to single-ended signal converter.

19. An amplifier comprising:
first and second terminals for receiving an operating potential;
third and fourth terminals for receiving input signals;
first, second, third and fourth transistors of similar conductivity type, each having a base and an emitter and a collector electrode, the emitter electrodes of said first and said second transistors being joined at a common interconnection, the base electrodes of said third and said fourth transistors being connected respectively to said third terminal and to said fourth terminal, the emitter electrodes of said third and said fourth transistors being connected respectively to said first transistor base electrode and to said second transistor base electrode, said first and said second transistors having similar transconductance characteristics, said third and said fourth transistors having similar transconductance characteristics differing from those of said first and said second transistors;
means for direct current conductively coupling said common interconnection to said second terminal; and
balanced to single-ended signal converter means having a first input terminal to which the collector electrodes of said first and said fourth transistors are connected, having a second input terminal to which the collector electrodes of said second and said third transistors are connected, having a common terminal connected to said first terminal and direct current conductive paths between each of its first and second input terminals and its common terminal, and having an output terminal for connection to a load.

20. An amplifier as set forth in claim 19 wherein said balanced to single-ended signal converter includes:
a fifth and a sixth transistors being of a conductivity type complementary to that of said first through fourth transistors, having respective emitter electrodes each connected to said first terminal, having respective collector electrodes direct current conductively coupled to the first and second input terminals of said balanced to single-ended signal converter, and having respective base electrodes to which said first input terminal is direct coupled, said second input terminal being coupled to said output terminal.

21. An amplifier as set forth in claim 19 wherein said balanced to single-ended signal converter includes:
a fifth and a sixth transistors being of a conductivity type complementary to that of said first through fourth transistors having respective emitter electrodes connected to said first terminal, having respective base emitter electrodes to which the first and second input terminals of said balanced to single-ended signal converter are respectively direct coupled, and having respective collector electrodes, said sixth transistor collector electrode coupled to said output terminal; and
a current mirror amplifier having a common terminal connected to said second terminal, having an input terminal to which the collector electrode of said fifth transistor is connected, and having an output terminal connected to the output terminal of said balanced to single-ended signal converter.

22. A circuit for speeding up the recovery of a transistor amplifier when the signal applied thereto tends to drive said transistor toward cut-off, said transistor having base, emitter and collector electrodes and exhibiting a capacitance at its base electrode which would tend to discharge if the transistor were to cut off, in combination:
a driver transistor having base and emitter and collector electrodes, said collector electrode being coupled to the base electrode of said amplifier transistor for coupling said signal thereto and said driver transistor being adapted to receive an input signal between its base and emitter electrodes; and
charging means coupled to said driver transistor and to the base electrode of said amplifier transistor and responsive to the driving transistor driving the amplifier transistor too close to cut-off for applying a charging current to the base electrode of the amplifier transistor for maintaining said capacitance charged.

23. In combination:
a driver transistor of one conductivity type having base, emitter and collector electrodes, adapted to receive an input signal between its base and emitter electrodes;
an amplifier including a second transistor of opposite conductivity to said driver transistor, having base, emitter and collector electrodes and direct coupled at its base electrode to the collector electrode of said driver transistor, said second transistor exhibiting a capacitance at its base electrode which tends to discharge when said driver transistor cuts off and tends to drive said second transistor to cut-off; and means coupled to an electrode of said driver transistor for sensing the approach the cut-off in said driver transistor and responding to supply a charging current to said capacitance.

* * * * *